(12) United States Patent
Jones et al.

(10) Patent No.: US 9,379,048 B2
(45) Date of Patent: Jun. 28, 2016

(54) DUAL-FLAG STACKED DIE PACKAGE

(71) Applicant: Semiconductor Components Industries, LLC, Phoenix, AZ (US)

(72) Inventors: Frank Tim Jones, Gilbert, AZ (US); Phillip Celaya, Gilbert, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 114 days.

(21) Appl. No.: 13/780,070

(22) Filed: Feb. 28, 2013

(65) Prior Publication Data

US 2014/0239472 A1    Aug. 28, 2014

(51) Int. Cl.
*H01L 23/495* (2006.01)
*H01L 23/29* (2006.01)
*H01L 23/00* (2006.01)
*H01L 23/31* (2006.01)

(52) U.S. Cl.
CPC ........ *H01L 23/49551* (2013.01); *H01L 23/295* (2013.01); *H01L 23/49562* (2013.01); *H01L 23/49575* (2013.01); *H01L 24/49* (2013.01); *H01L 23/3107* (2013.01); *H01L 24/06* (2013.01); *H01L 24/29* (2013.01); *H01L 24/32* (2013.01); *H01L 24/45* (2013.01); *H01L 24/73* (2013.01); *H01L 2224/04042* (2013.01); *H01L 2224/05554* (2013.01); *H01L 2224/05624* (2013.01); *H01L 2224/0603* (2013.01); *H01L 2224/2929* (2013.01); *H01L 2224/29101* (2013.01); *H01L 2224/32245* (2013.01); *H01L 2224/45014* (2013.01); *H01L 2224/45124* (2013.01); *H01L 2224/45144* (2013.01); *H01L 2224/45147* (2013.01); *H01L 2224/48111* (2013.01); *H01L 2224/48137* (2013.01); *H01L 2224/48145* (2013.01); *H01L 2224/48247* (2013.01); *H01L 2224/48465* (2013.01); *H01L 2224/48624* (2013.01); *H01L 2224/48724* (2013.01); *H01L 2224/48824* (2013.01); *H01L 2224/4903* (2013.01); *H01L 2224/49111* (2013.01); *H01L 2224/73265* (2013.01); *H01L 2225/06562* (2013.01); *H01L 2924/0781* (2013.01); *H01L 2924/13091* (2013.01); *H01L 2924/181* (2013.01)

(58) Field of Classification Search
CPC . H01L 23/49551; H01L 24/49; H01L 23/295; H01L 23/49562; H01L 23/49575; H01L 24/73; H01L 2225/06542; H01L 24/06; H01L 2924/0781; H01L 2224/32245; H01L 24/45; H01L 2224/49111; H01L 2224/05554; H01L 2224/48145; H01L 2224/05624
See application file for complete search history.

(56) References Cited

U.S. PATENT DOCUMENTS

| 7,898,092 B2 * | 3/2011 | Lu ........................ H01L 23/4952 257/666 |
| 8,299,588 B1 * | 10/2012 | Tateishi ............ H01L 23/49575 257/676 |
| 2008/0224323 A1 * | 9/2008 | Otremba ....................... 257/778 |

(Continued)

*Primary Examiner* — Jerome Jackson, Jr.
*Assistant Examiner* — Mohammed R Alam
(74) *Attorney, Agent, or Firm* — Kevin B. Jackson

(57) ABSTRACT

In one embodiment, a semiconductor package includes a first and a second die flag, wherein the first and second die flags are separated by a gap. First and second metal oxide semiconductor field effect transistor (MOSFET) die are on the first and the second die flags, respectively. A power control integrated circuit (IC) is stacked on top of at least one of the first or the second MOSFET die. A mold compound is encapsulating the power control IC, the first and second MOSFET die, and the first and second die flags.

17 Claims, 3 Drawing Sheets

(56) References Cited

U.S. PATENT DOCUMENTS

| | | | |
|---|---|---|---|
| 2009/0278243 A1* | 11/2009 | Chuang | H01L 21/4832 257/676 |
| 2011/0089549 A1* | 4/2011 | Zenbutsu | H01L 21/565 257/676 |
| 2011/0103438 A1* | 5/2011 | Tomita | H01L 21/4867 375/219 |
| 2012/0074546 A1* | 3/2012 | Chong | H01L 21/561 257/676 |
| 2012/0146205 A1* | 6/2012 | Fernando | H01L 23/49513 257/677 |
| 2012/0228782 A1* | 9/2012 | Kawata | H01L 21/565 257/777 |
| 2012/0298994 A1* | 11/2012 | Sawada | H01L 24/05 257/48 |

* cited by examiner

DUAL-FLAG STACKED DIE PACKAGE

BACKGROUND OF THE INVENTION

Embodiments disclosed in the present invention relate generally to electrical technology, and more specifically to a semiconductor component and method of fabricating the same.

For certain applications it is desirable to package multiple semiconductor integrated circuits (IC's), components, chips or die in a single package. For example, in a battery protection circuit application, a power control IC and two metal oxide semiconductor field effect transistors (MOSFETs) are packaged together in a lead frame package. The best performance for the battery protection package is achieved by using the largest possible MOSFET size to minimize the drain to source turn-on resistance ($R_{ds\text{-}on}$). However, a smaller overall size of the packaged IC's is desirable to accommodate ever shrinking electronic devices. To achieve a smaller footprint for multiple die in a single package, the die have been stacked on each other where possible.

Stacking of die on each other does, however, create challenges in the manufacturing and reliability of the package. In addition, along with the demands to shrink electronic devices there is also an ever present demand to improve the manufacturing of any integrated circuit packages. Accordingly, it would be desirable to develop a stacked die package having improved manufacturability and reliability.

For simplicity and clarity of illustration, elements in the figures are not necessarily drawn to scale, and the same reference numbers in different figures denote generally the same elements. Additionally, descriptions and details of well-known steps and elements may be omitted for simplicity of the description.

DETAILED DESCRIPTION OF THE DRAWINGS

Embodiments of the present invention provide packaged integrated circuits with better performance, smaller form factor and a superior pin-out arrangement and with improved manufacturability and reliability. The dual flag stacked die package may be utilized in a battery protection IC application to protect, for example a lithium-ion or lithium polymer battery cell. In an embodiment of the present invention, a power control IC is stacked on top of two separate MOSFET die on two separate flags or die pads. The two flags or die pads are easier to board mount than a single, large flag. A large, single flag or die pad used when two MOSFETs are integrated on to a single die in the past is much more difficult to board mount. This is due to the fact that when mounting a package to a circuit board, an electronic component having a single, large flag, the large footprint of the flag causes the electronic component to move or float in an uncontrollable manner. This movement while board mounting makes it difficult to control the alignment of the package pin connection to the solder of the circuit board. Thus, the package of the past caused more difficulties in manufacturing end products. In addition a large, single die flag used in the past creates mold flow issues. The mold flow problems can create reliability issues for the package. As will be set forth below, this invention solves these manufacturability and reliability issues of the past by providing the two MOSFET die each on their own die flag with a gap between each die flag.

Figure 1:
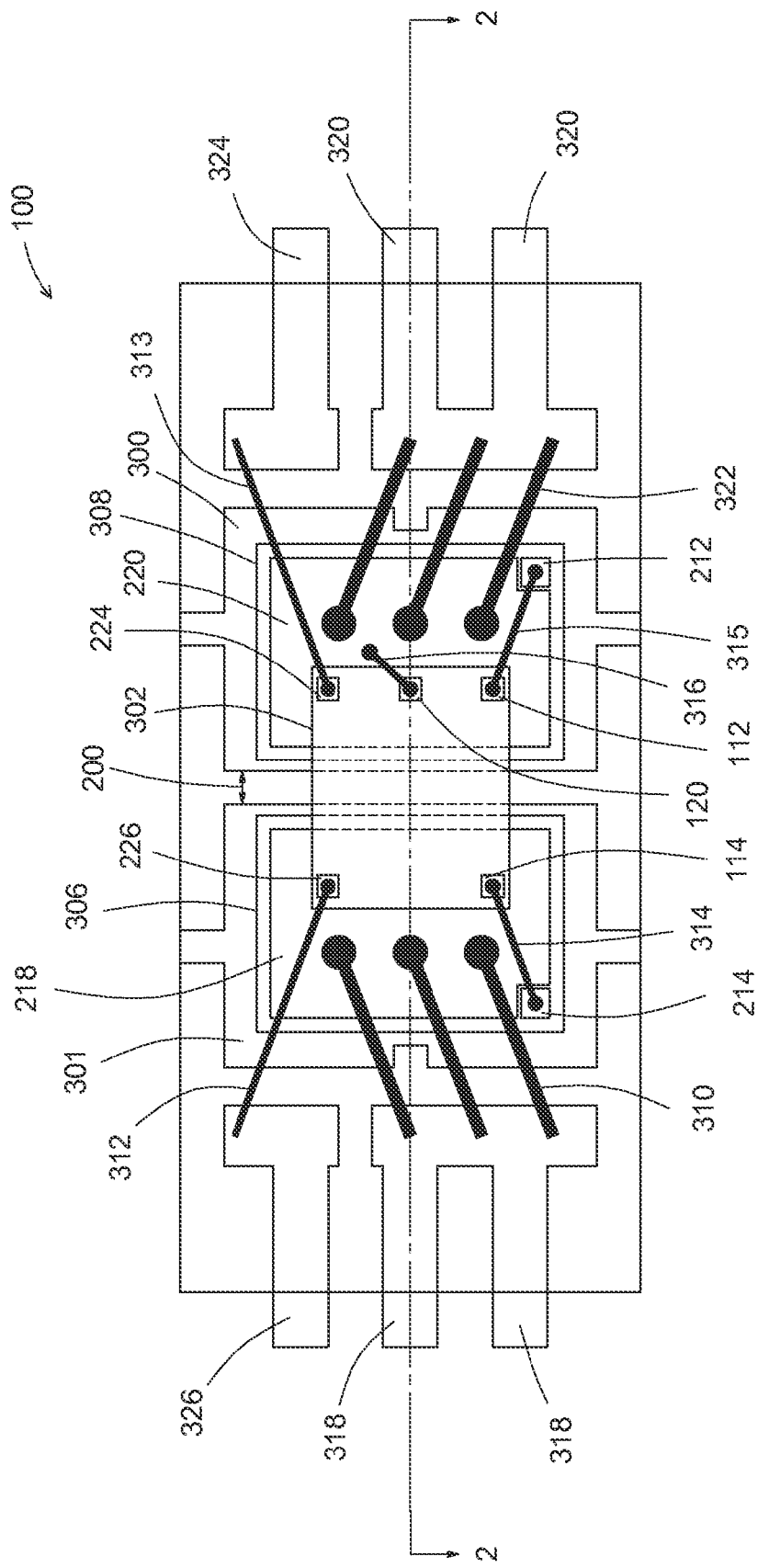
FIG. 1 is a top view of a dual flag stacked die package in accordance with an embodiment of the present invention.

FIG. 1 illustrates a top view of a dual flag stacked die package 100 in accordance with a first embodiment of the invention. In one embodiment, package 100 is a battery protection IC package and includes two separate die 306 and 308 having MOSFETs formed therein placed on or attached to separate die flags or pads 300 and 301 with a gap 200 in between the die flags 301 and 300, respectively. In one embodiment, the two MOSFET die 306 and 308 are of equal size. As shown in FIG. 1, two MOSFET die 306 and 308, each fabricated on physically separate semiconductor chips, may have the substantially the same source 218 and 220 size and gate 214 and 212 size and are attached onto a die flag 301 and die flag 300. Die flag 301 and 300 are physically separate flags. The source (218 and 220) and gate (214 and 212) layout of the MOSFET die 306 and 308 may be placed so that they are symmetric along the centerline of the MOSFET die 306 and 308. A power control IC 302 is stacked on top of the two MOSFET die 306 and 308 and in this embodiment, overlaps both portions of the source areas 218 and 220 of MOSFET die 306 and 308 but not the gate areas 212 and 214.

In a battery protection application, input pad 224 formed on the power control IC 302 is electrically coupled to the supply voltage pin or lead 324 through a bonding wire 313. Supply voltage pin 324 may be connected to the anode of a battery through a resistor (not shown). Input pad 226 formed on the power control IC 302 is electrically coupled to the voltage monitor pin 326 through a bonding wire 312. Ground pins 320 may be electrically coupled to the cathode (not shown) of the battery and in this embodiment are positioned on the right side of package 100 and are electrically coupled to the source pad 220 of MOSFET 308, preferably through multiple bonding wires 322. In this embodiment MOSFET 308 serves as an internal discharge MOSFET. A ground pad 120 of power control IC 302 is electrically coupled to the source pad 220 of the MOSFET 308 through a bond wire 316. Output pad 112 of the power control IC 302 is electrically coupled to gate pad 212 of MOSFET 308 through bond wire 315 to enable or disable the battery protection IC to discharge. Output pad 114 of the power control IC 302 is electrically coupled to gate pad 214 of MOSFET 306 through bond wire 314 to enable or disable the battery protection IC to charge. Source pad 218 of the MOSFET 306 may be electrically coupled to coupled leads or pins 318, preferably through multiple bond wires 310.

In this embodiment, the distance between bonding wires 310 and the distance between the bonding wires 322 are spaced apart thereby providing lower electrical resistance. The bond wires disclosed above may be made of a suitable metal including, but not limited to, gold (Au), copper (Cu) or aluminum (Al). The gate metal pads 212 and 214 and source metal pads 218 and 220 are preferably of 3-5 micron thick aluminum on each of the two MOSFET die 306 and 308 and are located on a portion of the top surface of the MOSFET die 306 and 308. Alternatively, the source pads 218 and 220 of two MOSFET die 306 and 308 may be electrically coupled to the coupled leads 318 and coupled leads 320 through aluminum ribbons (not shown) instead of bond wires. Aluminum ribbons are known alternatives to multiple bond wires.

An undesirable effect of stacking two die over each other is an increase of package 100 thickness which could limit the scope of application or even render the resulting device useless. To reduce the overall thickness of the package 100, thinner die less than standard 8 mils may be used. Preferably the die thickness for both IC 302 and the MOSFET die 306 and 308 is less than 6 mils. The reduced thickness of MOSFET die 306 and 308 further reduce the turn-on resistances of the MOSFET die 306 and 308.

Figure 2A:
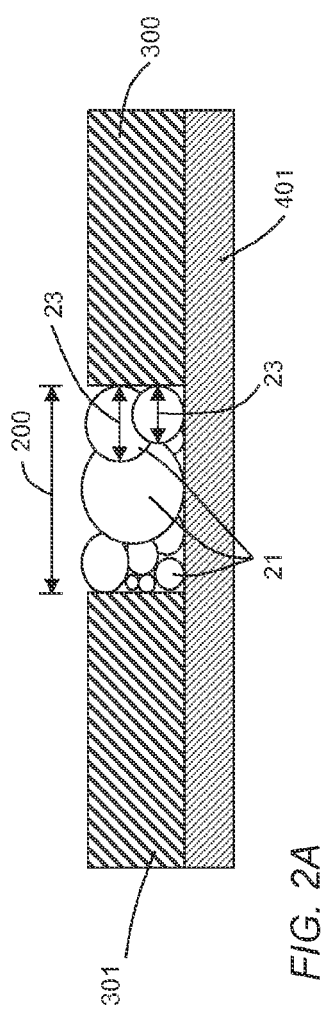
FIG. 2A is a view of a portion of the cross-sectional view of the dual flag stacked die package of FIG. 2.
Figure 2:
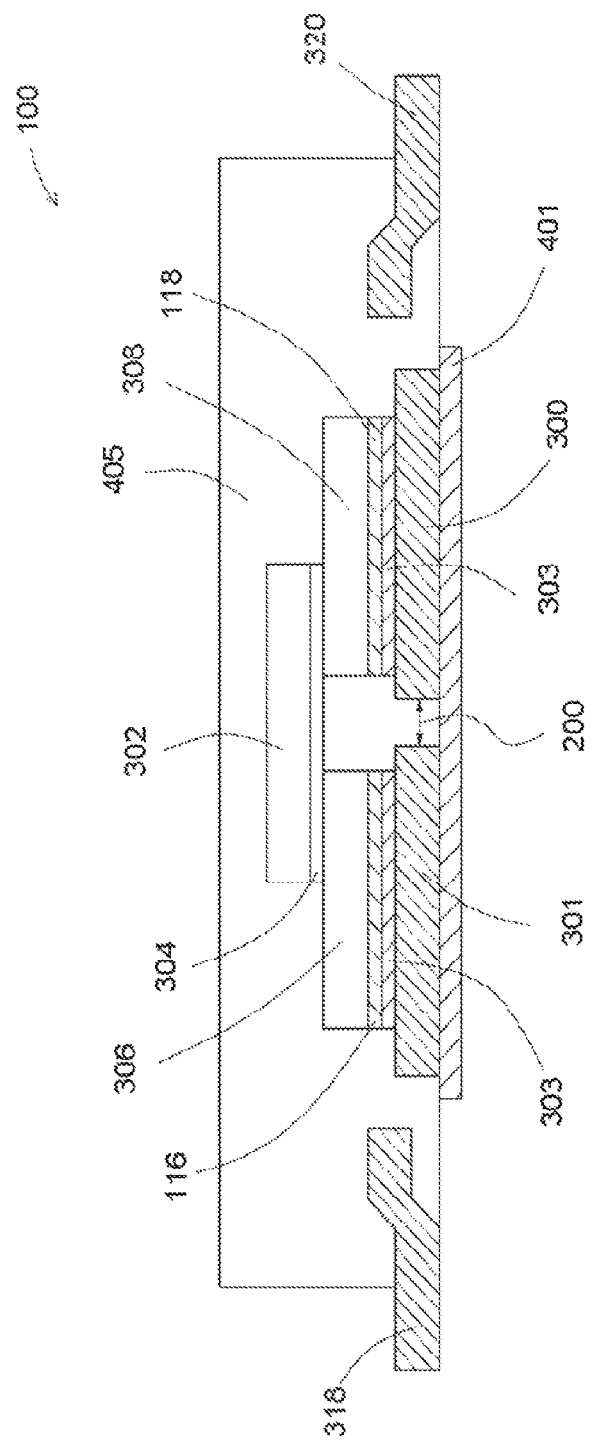
FIG. 2 is a cross-sectional view along a section 2-2 of the dual flag stacked die package of FIG. 1.

FIG. 2 is a simplified, cross-sectional view of the dual flag stacked die package 100 of FIG. 1 along section 2-2. To avoid cluttering FIG. 2, all of the elements shown in FIG. 1 are not shown. FIG. 2 shows the drain metal pads 116 and 118 of the two MOSFET die 306 and 308, respectively, which are located on the bottom surface of the MOSFET die 306 and 308 and may be comprised of about 1 to 3 microns of TiNiAg. The drain pads 116 and 118 of the two MOSFET die 306 and 308 are electrically coupled to the lead frame die flag 301 and die flag 300 through an electrically conductive bonding agent 303, which can be soft solder, electrically conductive epoxy and other electrically conductive adhesive.

An insulating adhesive layer 304, such as an electrically non-conductive epoxy layer is formed between the power control IC 302 and the top of the two MOSFET die 306 and 308. The insulating adhesive layer 304 not only provides mechanical bonding between the power control IC 302 and MOSFET die 306 and 308, but also serves as an electrical insulating barrier because there exists an electrical potential difference between the power control IC 302 and MOSFET die 306 and 308 that will cause device malfunction if not insulated properly.

Traditional epoxy dispensing and die attaching in IC packaging may not provide adequate insulation between sources of MOSFET die 306 and 308 and power control IC 302. To ensure proper insulation, special steps may be followed to form a high quality insulation layer 304. In one embodiment, a non-conductive epoxy such as Ablesbond 8006NS or Ablecoat 8008NC from Abelstik Laboratories of Rancho Dominguez, Calif., is coated on the backside of power control IC 302 in wafer form, and then half cured in an oven. Power control IC 302 with half cured back coated epoxy is diced and attached onto the MOSFET 306 and 308 at elevated temperature and then fully cured. In another embodiment, a second non-conductive epoxy is applied to the top surface of MOSFET die 306 and 308 before the power control IC die 302 is coated with a first layer of nonconductive epoxy attached thereon. In another embodiment the two MOSFET die 306 and 308 further include a passivation layer (not shown) formed atop the source for further insulation.

A mold compound 405 is formed to encapsulate the power control IC 302, MOSFET die 306 and 308, as well as around die flags 301 and 300. Gap 200 is preferably wide enough to allow mold compound 405 to flow into gap 200 to enhance the bonding of mold compound 405 around die flags 301 and 300. The enhanced bonding of mold compound 405 around the die flags 301 and 300 in the gap 200 improves the reliability of package 100.

In the packages manufactured in the past, the single, large flag tended to create mold flow imbalance between the top half and the bottom half of the package. This mold flow imbalance could result in incomplete fills with resulting voids in the mold compound of the package. The voids cause reliability issues because moisture may be allowed to penetrate the package and affect the electronic components.

The package 100 of the present invention solves this problem by including two separate die flags 301 and 300 with a gap 200. Gap 200 allows more of a path for mold compound 405 to fill the volume around power control IC 302, MOSFET die 306 and 308, as well as around die flags 301 and 300. This allows for a wider mold process parameter window to be utilized in manufacturing which results in improved consistency in the quality of packages 100 manufactured in a production setting. The wider mold process parameters able to be utilized in the present invention include, for example, faster transfer speed of the mold compound 405, wider temperature range during encapsulation, and increased flexibility in selection of materials comprising mold compound 405.

Although the present invention requires the use of smaller die size of MOSFET die 306 and 308 (which results in increased $R_{ds-on}$) due to the smaller overall flag area available for the same package 100 size, the increase in $R_{ds-on}$ is small enough that a package 100 manufactured in accordance with the present invention is able to meet customer specifications.

In one embodiment, mold compound 405 is typically comprised of a Multi-Aromatic-Resin (MAR) or Orth-Cresol-Novolac (OCN) resin, and gap 200 is preferably between 100 and 300 microns in thickness. Most preferably, gap is less than 200 microns in order to minimize the overall length of package 100 from lead to lead or the decrease in size of MOSFET die 306 and 308. In order to minimize the size of gap 200 (and the resultant effect on the overall package size or MOSFET die size), it is preferable to use mold compounds 405 with a filler material 21 having a relatively small filler size 23 less than the width of gap 200 and having a spherical shape. However, the width of gap 200 may be increased to allow filler material 21 to have more irregular shaped and/or larger filler sized mold compound 405. In one embodiment, the filler size 23 of mold compound 405 is less than the width of the gap 200, but more preferably the average filler size 23 is less than one half the width of the gap 200. In another embodiment, if gap 200 has a width of approximately 200 microns, it is preferred that the filler size 23 of filler material of mold compound 405 be approximately 75 microns.

Die flags 300 and 301 are electrically coupled together, preferably at a next level in the assembly which is not part of package 100, but part of a printed circuit board (not shown) to which package 100 is mounted. In one embodiment, die flags 300 and 301 are electrically coupled together through an electrically conductive layer 401 in order to electrically couple drain pads 116 and 118. In an alternate embodiment, electrically conductive layer 401 may be comprised of two physically separate layers (not shown) instead of a single layer and the two physically separate electrically conductive layers 401 are electrically coupled through the printed circuit board itself. Electrically conductive layer(s) 401 is typically comprised of copper with a coating to protect it from oxidation, such as a tin solder. Conductive layer 401 may be in the form of a solder paste that is stenciled or squeegeed on to a circuit board (not shown).

As has been stated previously, one advantage of the present invention is that two flags or die pads 300 and 301 are easier to board mount than a single, large flag used in the past. This is due to the fact that when board mounting a package having a single, large flag, the large footprint of the single flag causes the electronic component to move or float in an uncontrollable manner. This movement while mounting a package onto a circuit board makes it difficult to control the package pin connection solder alignment. In contrast, the fact that flags 300 and 301 of the present invention are broken up by a section of mold compound 405 therebetween increases the surface tension and minimizes the movement or floating while board mounting package 100. Thus, the package 100 of the present invention is more manufacturable which increases the yield of end product manufactured on a printed circuit board. Referring back to FIG. 1 and FIG. 2, it should be readily apparent that, in another embodiment of the present invention, for a battery protection IC application, leads or pins 324 and 320 may be on the left side of package 100 and leads 326 and 318 may be on the right side of package 100 with MOSFET 306 and 308 moved from left to right and corresponding input pads of power control IC 302 and gate pads 214 and 212 of MOSFET die 306 and 308 also moved from left to right on the respective die, thus providing essentially a mirror image along a line perpendicular to line 2-2. As can be appreciated by designers of integrated circuits, pad locations on power control IC 302 and two MOSFET die 306 and 308 may be different than that shown in FIG. 1.

Figure 3:
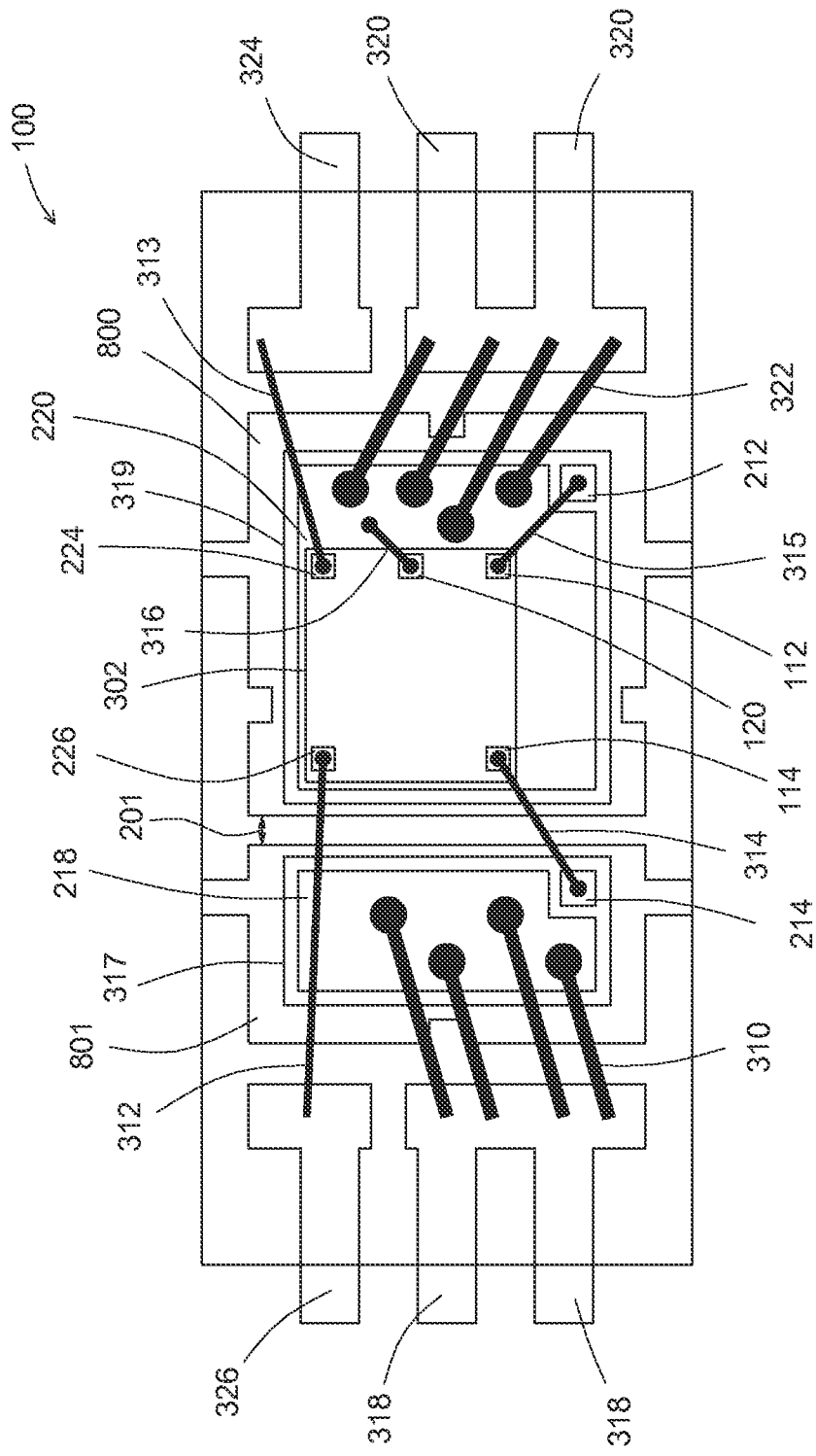
FIG. 3 is a top view of a dual flag stacked die package in accordance with another embodiment of the present invention.

FIG. 3 is a top view of alternative dual flag stacked die package 100 with two discrete MOSFET die 317 and 319 of unequal size on a die flag 801 and 800 with a gap 201 between die flags 801 and 800. Elements which are the same of the embodiment shown in FIGS. 1 and 2 are referenced by the same number. In the embodiment shown, a first MOSFET 317 is smaller than a second MOSFET 319. In FIG. 3, leads 324 and 320 are on the right side of package 100, and leads 326 and 318 are on the left side of package 100. As shown in FIG. 3, in this embodiment, a power control IC 302 is stacked only on the MOSFET 319 in such a way that a long side of the power control IC 302 is parallel to a long side of the MOSFET 319. As is readily apparent, power control IC 302 may be of different dimensions and placed over MOSFET 319, if rectangular, having either the long or short side be perpendicular to the long side of MOSFET 319. It is also readily apparent that MOSFET 317 can be placed on the right side and MOSFET 319 can be placed on the left (not shown) with pads of both the power IC 302 and the MOSFET die 317 and 319 positioned to accommodate the electrical coupling between power IC 302 and MOSFET die 317 and 319 and leads 324, 320, 326, and 318 as described above with reference to FIG. 1, but the respective leads being a mirror image of that shown in FIG. 3. Furthermore, power control IC 302 may be placed over a portion of both MOSFET die 317 and 319 as well.

From all of the foregoing, one skilled in the art can determine that according to one embodiment a semiconductor package structure (for example, element 100) includes a first and second die flags (for example, elements 300 and 301, 800 and 801), wherein the first and second die flags are separated by a gap (for example, elements 200, 201). A first and second metal oxide semiconductor field effect transistor (MOSFET) die (for example, elements 306 and 308, 317 and 319) are on the first and the second die flags, respectively. A power control integrated circuit (IC) (for example, element 302) is stacked on top of at least one of the first or the second MOSFET die. A mold compound (for example, element 405) encapsulates the power control IC, the first and second MOSFET die, and the first and second die flags.

Those skilled in the art will also appreciate that according to another embodiment, the structure described herein further includes the gap having a width between 100-300 microns.

Those skilled in the art will also appreciate that according to another embodiment, the structure described herein further includes a mold compound comprised of a filler material having an average size less than one half the width of the gap.

Those skilled in the art will also appreciate that according to another embodiment, a dual flag stacked die package (for example, element 100) includes first and second physically separate die flags (for example, elements 300 and 301, 800 and 801), wherein the first and second die flags are separated by a gap (for example, elements 200, 201). First and second metal oxide semiconductor field effect transistor (MOSFET) die (for example, elements 306 and 308, 317 and 319) are mounted on and electrically coupled to the first and the second die flags, respectively. A power control integrated circuit (IC) (for example, element 302) is vertically mounted on top of at least one of the first or the second MOSFET die through a nonconductive epoxy (for example, element 304). A mold compound (for example, element 405) is disposed around the power control IC, the first and second MOSFET die, the first and second die flags, and disposed in the gap.

Those skilled in the art will also appreciate that according to still another embodiment, a method of making a semiconductor package (for example, element 100) includes providing a first and a second die flag (for example, elements 300 and 301, 800 and 801), wherein the first and second die flags are separated by a gap (for example, elements 200, 201). The method includes attaching first and second metal oxide semiconductor field effect transistor (MOSFET) die (for example, elements 306 and 308, 317 and 319) on the first and the second die flags, respectively. The method includes placing a power control integrated circuit (IC) (for example, element 302) on top of at least one of the first or the second MOSFET die. The method includes encapsulating the power control IC, the first and second MOSFET die, and the first and second die flags with a mold compound (for example, element 405).

Those skilled in the art will also appreciate that according to another embodiment, the method described herein further includes encapsulating with a mold compound comprised of a filler material having an average size less than one half the width of the gap.

In view of all the above, it is evident that a novel structure and method is disclosed. Included, among other features, are first and second separate die flags, wherein the first and second die flags are separated by a gap. First and second metal oxide semiconductor field effect transistor (MOSFET) die are on the first and the second die flags, respectively. In one embodiment, the MOSFET die are substantially equal in size. A power control integrated circuit (IC) is stacked on top of at least one of the first or the second MOSFET die. In another embodiment, the power control IC is stacked on both MOSSFET die. A mold compound is encapsulating the power control IC, the first and second MOSFET die, and the first and second die flags. In another embodiment, the package is a battery protection IC package. The package and method increases manufacturability and reliability while still providing for a package structure with a smaller footprint.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention, and form different embodiments, as would be understood by those skilled in the art.

We claim:

1. A semiconductor package, comprising: first and second die flags each having a top and a bottom surface, wherein the first and second die flags are separated by a gap, and wherein the first and the second die flags are electrically coupled through a conductive layer formed on the bottom surface of the first and the second die flags; first and second metal oxide semiconductor field effect transistor (MOSFET) die, each having a drain metal pad on a bottom surface of the MOSFET die, wherein the drain metal pads are positioned on the top surface of the first and the second die flags, and wherein the drain metal pad of the first MOSFET die is electrically coupled to the drain metal pad of the second MOSFET die, respectively; a power control integrated circuit (IC) stacked on top of at least one of the first or the second MOSFET die; a mold compound encapsulating the power control IC, the first and second MOSFET die, and the first and second die flags.

2. The semiconductor package of claim 1 wherein the gap between the first and the second die flag is approximately between 100 and 300 microns.

3. The semiconductor package of claim 1 wherein the gap between the first and the second die flag is less than 200 microns.

4. The semiconductor package of claim 1 wherein the mold compound is disposed between the gap thereby improving reliability of the semiconductor package, and wherein the bottom surface of the mold compound in the gap is substantially coplanar with the bottom surface of the first and second die flags.

5. The semiconductor package of claim 1 wherein the mold compound is comprised of a filler material including an average size of materials less than one half the width of the gap.

6. The semiconductor package of claim 1 wherein the mold compound is comprised of a filler material having a spherical shape.

7. The semiconductor package of claim 1 wherein the power control IC is electrically coupled to a first and second lead and the first MOSFET die is electrically coupled to a third lead and the second MOSFET die is electrically coupled to a fourth lead.

8. The semiconductor package of claim 7 wherein the first MOSFET die is electrically coupled to a fifth lead and the second MOSFET die is electrically coupled to a sixth lead.

9. The semiconductor package of claim 1 wherein the power control IC is electrically coupled to a gate of the first MOSFET and a gate and a source of the second MOSFET.

10. A dual flag stacked die package, comprising: first and second physically separate die flags each having a top and a bottom surface, wherein the first and second die flags are separated by a gap; first and second metal oxide semiconductor field effect transistor (MOSFET) die each having a top and a bottom surface, wherein the bottom surface is mounted on and electrically coupled to the top surface of the first and the second die flags, respectively; the first and second die flags electrically coupled to each other through a conductive layer formed on the bottom surface of the first and the second die flags; a power control integrated circuit (IC) vertically mounted on top of at least one of the first or the second MOSFET die through a nonconductive epoxy; a mold compound encapsulating the power control IC, the first and second MOSFET die, the first and second die flags, and disposed in the gap, wherein the bottom surface of the mold compound in the gap is substantially coplanar with the bottom surface of the first and second die flags, wherein the gap between the first and the second die flag is less than approximately 300 microns.

11. The dual flag stacked die package of claim 10 wherein the gap between the first and the second die flag is less than 200 microns.

12. The dual flag stacked die package of claim 10 further comprising: the first and second MOSFET die electrically coupled to the first and the second die flag, respectively; the first and second die flags electrically coupled to each other.

13. The dual flag stacked die package of claim 10 wherein the mold compound is comprised of a filler material including an average size of materials less than one half the width of the gap.

14. The dual flag stacked die package of claim 10 wherein the mold compound is comprised of a filler material having a spherical shape.

15. A method of making a semiconductor package, comprising: providing a first and a second die flag, each having a top and a bottom surface, wherein the first and second die flags are separated by a gap; attaching drain metal pads of a first and second metal oxide semiconductor field effect transistor (MOSFET) die on the first and the second die flags, respectively; placing a power control integrated circuit (IC) on top of at least one of the first or the second MOSFET die; encapsulating the power control IC, the first and second MOSFET die, and the first and second die flags with a mold compound; wherein the step of encapsulating further comprises the mold compound being formed between the gap thereby improving reliability of the semiconductor package, and wherein the bottom surface of the mold compound in the gap is substantially coplanar with the bottom surface of the first and second die flags, and wherein the first and the second die flags are electrically coupled through a conductive layer formed on the bottom surface of the first and the second die flags; and electrically coupling the drain metal pads of the first and the second MOSFET die and the first and the second die flags.

16. The method of making the semiconductor package of claim 15 wherein the gap between the first and the second die flag is less than approximately 300 microns.

17. The method of making the semiconductor package of claim 15 wherein the step of encapsulating further comprises the mold compound being comprised of filler material having an average size of materials less than one half the width of the gap.

* * * * *